United States Patent
Butendeich et al.

(10) Patent No.: US 10,868,223 B2
(45) Date of Patent: Dec. 15, 2020

(54) OPTOELECTRONIC COMPONENT

(71) Applicant: OSRAM OLED GmbH, Regensburg (DE)

(72) Inventors: Rainer Butendeich, Sinzing (DE); Alexander Baumgartner, Donaustauf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/254,659

(22) Filed: Jan. 23, 2019

(65) Prior Publication Data
US 2019/0229244 A1 Jul. 25, 2019

(30) Foreign Application Priority Data
Jan. 23, 2018 (DE) .......... 10 2018 101 428

(51) Int. Cl.
*H01L 33/50* (2010.01)
*C09K 11/77* (2006.01)
*C09K 11/08* (2006.01)
*C09K 11/61* (2006.01)

(52) U.S. Cl.
CPC ........ *H01L 33/504* (2013.01); *C09K 11/0883* (2013.01); *C09K 11/617* (2013.01); *C09K 11/7734* (2013.01); *C09K 11/7774* (2013.01)

(58) Field of Classification Search
CPC ..... H01L 33/504; H01L 33/50; H01L 33/501; H01L 33/502; C09K 11/7734; C09K 11/617; C09K 11/0883; C09K 11/7774
See application file for complete search history.

(56) References Cited

U.S. PATENT DOCUMENTS

| | | | | |
|---|---|---|---|---|
| 4,314,910 A | * | 2/1982 | Barnes | C09K 11/7774 252/301.4 R |
| 8,597,545 B1 | * | 12/2013 | Liu | C09K 11/0883 252/301.4 F |
| 9,234,132 B2 | * | 1/2016 | Baumann | C04B 35/581 |
| 9,951,926 B2 | * | 4/2018 | Windisch | H01L 33/504 |
| 2014/0117841 A1 | * | 5/2014 | Windisch | H01L 33/504 313/503 |
| 2016/0218255 A1 | * | 7/2016 | Kim | H01L 33/504 |
| 2017/0005239 A1 | * | 1/2017 | Asai | C09K 11/00 |
| 2017/0054059 A1 | * | 2/2017 | Hosokawa | H01L 33/504 |
| 2017/0179347 A1 | * | 6/2017 | Asai | C09K 11/0883 |
| 2017/0342320 A1 | | 11/2017 | Tsumori et al. | |

(Continued)

FOREIGN PATENT DOCUMENTS

DE 10 2009 037 730 A1 2/2011
WO 2013/000615 A1 1/2013

*Primary Examiner* — Joseph C. Nicely
(74) *Attorney, Agent, or Firm* — DLA Piper LLP (US)

(57) ABSTRACT

An optoelectronic component includes a semiconductor chip that emits primary radiation from the blue spectral region, a conversion element including at least three phosphors each converting the primary radiation into secondary radiation, wherein the first phosphor emits secondary radiation from the green spectral region, the second phosphor emits secondary radiation from the red spectral region, the third phosphor is a potassium-silicon-fluoride phosphor that emits secondary radiation from the red spectral region, and the component has an Ra value of at least 80 and an R9 value of at least 75, and emits white mixed radiation.

20 Claims, 8 Drawing Sheets

(56) References Cited

U.S. PATENT DOCUMENTS

| | | | | |
|---|---|---|---|---|
| 2017/0345976 A1* | 11/2017 | Asai | ...................... | H01L 33/504 |
| 2018/0033922 A1* | 2/2018 | Iwakura | .................. | H01L 33/46 |
| 2018/0112129 A1* | 4/2018 | Chen | ........................ | H01L 33/56 |
| 2018/0139817 A1* | 5/2018 | Yamakawa | .............. | H01L 33/56 |
| 2018/0212128 A1* | 7/2018 | Hayashi | ............... | G02B 6/0003 |
| 2019/0013448 A1* | 1/2019 | Nakano | ................. | H01L 33/504 |
| 2019/0062631 A1* | 2/2019 | Kobayashi | ............ | H01L 33/502 |
| 2019/0088833 A1* | 3/2019 | Itoga | .................. | C09K 11/0883 |
| 2019/0091355 A1* | 3/2019 | Ukawa | ...................... | A61L 2/26 |

* cited by examiner

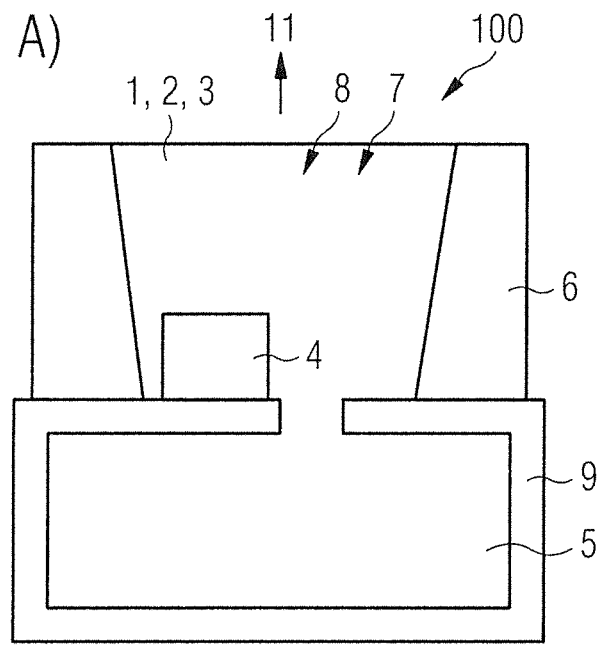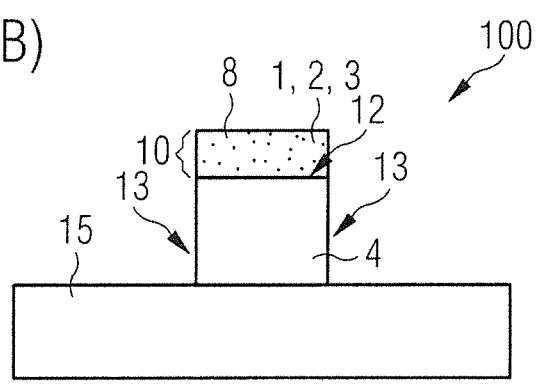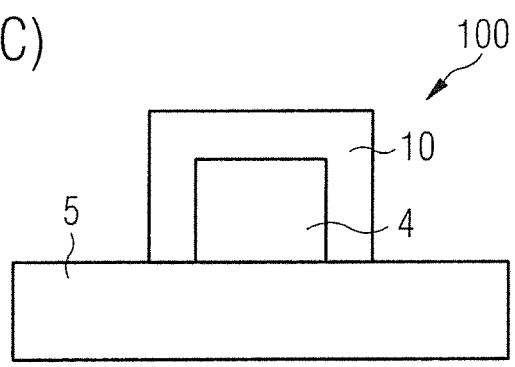

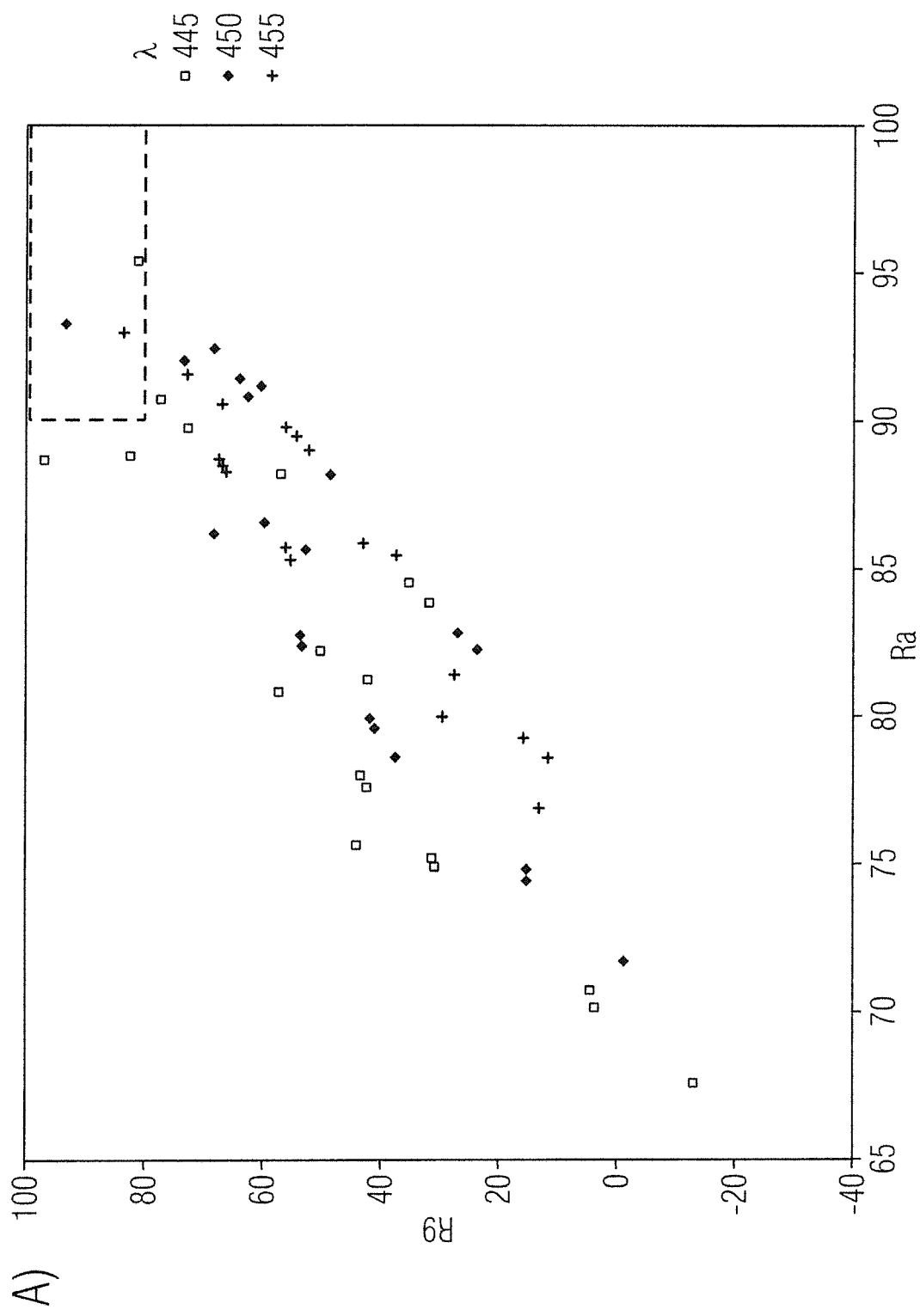

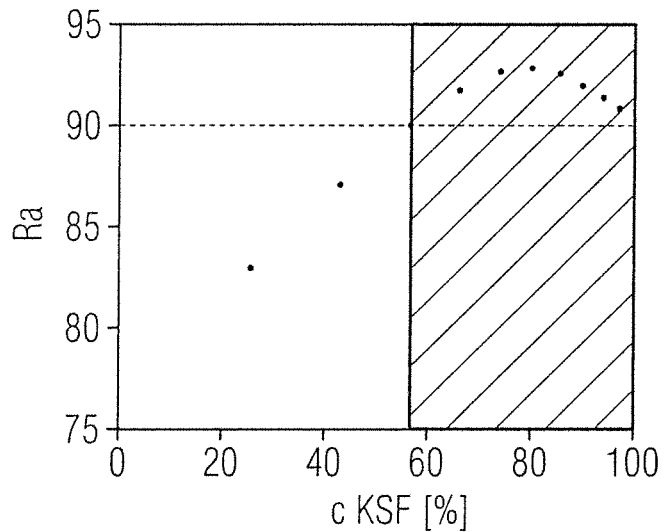
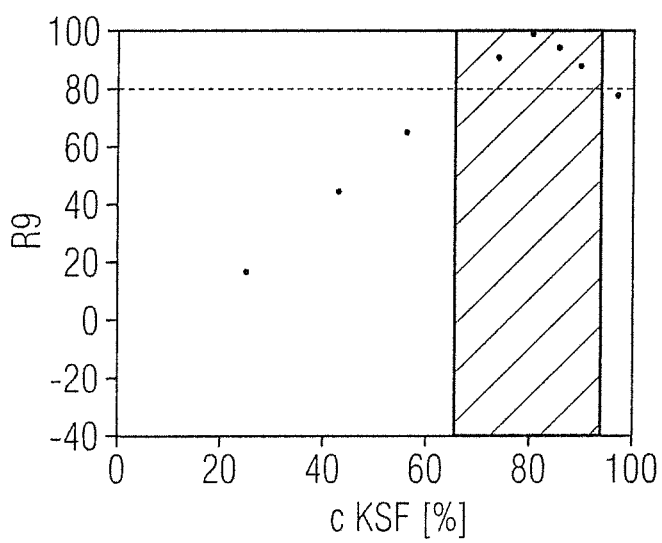
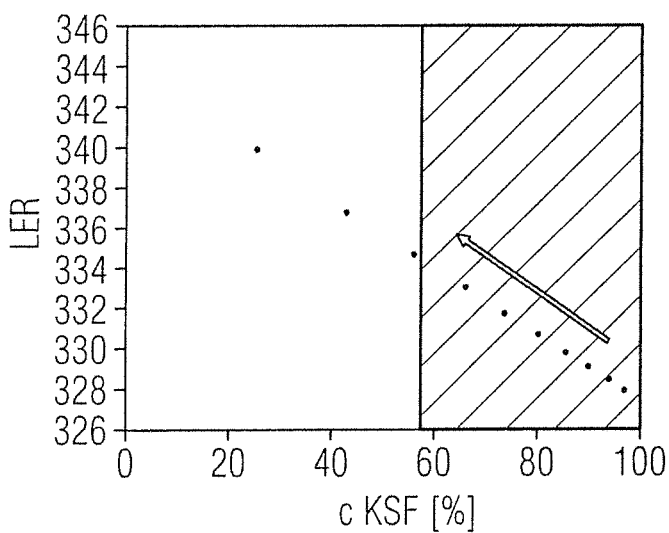

OPTOELECTRONIC COMPONENT

TECHNICAL FIELD

This disclosure relates to an optoelectronic component.

BACKGROUND

Optoelectronic components may have at least one conversion element containing phosphors. For example, it is advantageous for the usage of optoelectronic components for general lighting if the CRI range lies between CRI80 and CRI100. In addition, it is advantageous if the luminescent materials exhibit the narrowest possible emission band. Narrow-band phosphors emitting radiation from the red spectral range are particularly advantageous. A possible narrow-band phosphor is, for example, a potassium-silicon-fluoride phosphor. In combination with another phosphor emitting radiation from the green spectral range, a CRI80/90 system can be assembled.

However, such potassium-silicon-fluoride phosphor has disadvantages that can have a disturbing effect on the component. The potassium-silicon-fluoride phosphor, for example, exhibits saturation effects at high excitation intensities and thus leads to changes in parameters such as the color location, CRI or R9.

Compared to conventional phosphors, potassium-silicon-fluoride phosphor has a long rise time to emission when operating the optoelectronic component in PWM dimming mode (pulse-width modulation; square pulses, for example, between two currents, zero and the operating current, for brightness dimming, as an alternative to operation at low currents). Compared to optoelectronic components with conventional phosphors, this leads to a low ageing stability so that the optoelectronic component exhibits a stronger ageing. In addition, such an optoelectronic component that contains the potassium-silicon-fluoride phosphor as a red component, has the disadvantage that the CRI/R9 setting is difficult to achieve, especially in the high CRI range (CR90+), and may restrict the CCT range that can be used.

SUMMARY

We provide an optoelectronic component including a semiconductor chip that emits primary radiation from the blue spectral region, a conversion element including at least three phosphors each converting the primary radiation into secondary radiation, wherein the first phosphor emits secondary radiation from the green spectral region, the second phosphor emits secondary radiation from the red spectral region, the third phosphor is a potassium-silicon-fluoride phosphor that emits secondary radiation from the red spectral region, and the component has an Ra value of at least 80 and an R9 value of at least 75, and emits white mixed radiation.

BRIEF DESCRIPTION OF THE DRAWINGS

FIG. 5A shows dependence of Ra on the concentration of the third phosphor according to an example.

FIG. 5B shows dependence of the R9 on the concentration of the third phosphor according to an example.

FIG. 5C shows efficiency advantages depending on the concentration of the third phosphor.

Figure 1:
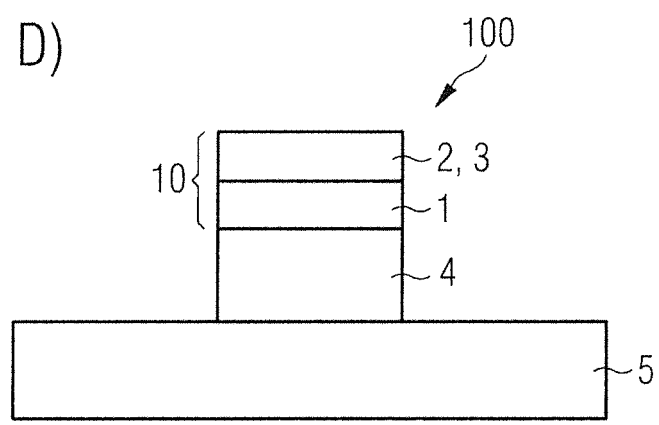
FIG. 1A is a schematic side view of an optoelectronic component according to an example.
FIG. 1B is a schematic side view of an optoelectronic component according to an example.
FIG. 1C is a schematic side view of an optoelectronic component according to an example.
FIG. 1D is a schematic side view of an optoelectronic component according to an example.
FIG. 1E is a schematic side view of an optoelectronic component according to an example.
Figure 1:
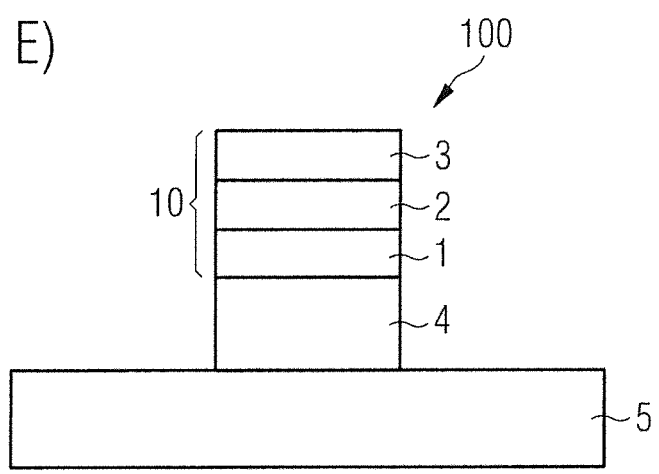

REFERENCE CHARACTER LIST 100 optoelectronic component
1 first phosphor
2 second phosphor
3 third phosphor
4 semiconductor chip
5 carrier or substrate
6 housing
7 recess
8 matrix material
9 lead frame
10 conversion element
11 total radiation, mixed radiation
12 radiation main side of the semiconductor chip
13 side surfaces of the semiconductor chip

DETAILED DESCRIPTION

Our optoelectronic component has a semiconductor chip. The semiconductor chip is capable of emitting primary radiation from the blue spectral range. The optoelectronic component has a conversion element. The conversion element has at least three phosphors. In particular, the conversion element has exactly three phosphors. The phosphors are each capable of converting primary radiation into secondary radiation. The three phosphors can be a first phosphor, a second phosphor and a third phosphor. The first phosphor is capable of emitting secondary radiation from the green spectral range. The second phosphor is capable of emitting secondary radiation from the red spectral range. The third phosphor is a potassium-silicon-fluoride phosphor. The third phosphor is capable of emitting radiation from the red spectral range. The component has a Ra value and an R9 value. The Ra value is at least 80. The R9 value is at least 75. The component is capable of emitting white mixed radiation.

In particular, the following is fulfilled in at least one example of the component:

For the Ra value equal to 80, an R9 value is >0. For the Ra value of 90, an R9 value is >90, in particular R9>95. For the Ra value of 97, an R9 value is >90, in particular R9>95.

In this context, "capable of" means that the optoelectronic component emits white mixed radiation, especially during operation. In other words, the primary radiation of the semiconductor chip is not completely converted into secondary radiation, but in particular the white mixed radiation is a sum of primary radiation and secondary radiation of the three phosphors.

The fact that the phosphors are capable of emitting means that the phosphors are configured to absorb and/or transmit primary and secondary radiation. In particular, they emit secondary radiation during operation of the optoelectronic component.

The term "component" does not only refer to finished components such as light emitting diodes (LEDs) or laser diodes, but also to substrates and/or semiconductor layers so that, for example, a composite of a copper layer and a semiconductor layer can already represent a component and be part of a higher-level second component to which, for example, additional electrical connections are provided. The optoelectronic component can be, for example, a thin-film semiconductor chip, in particular a thin-film LED chip.

Color specifications in relation to emitting phosphors denote the respective spectral range of the electromagnetic radiation.

The fact that the first phosphor is capable of emitting secondary radiation from the green spectral range refers in particular to wavelengths or peak wavelengths of 500 nm to 580 nm.

The fact that the second and/or third phosphor is/are capable of emitting secondary radiation from the red spectral range refers in particular to wavelengths or peak wavelengths between 580 nm and 650 nm.

That the semiconductor chip is capable of emitting primary radiation from the blue spectral range refers in particular to wavelengths or peak wavelengths of 430 nm to 470 nm.

The component is capable of emitting white mixed radiation. Mixed radiation here means in particular the sum of primary radiation and secondary radiation. The component therefore has a partial conversion. White mixed radiation can be defined as light with a color location corresponding to the color location of a Planck blackbody or deviates from the color location of a Planck blackbody by less than 0.07 and preferably by less than 0.05, for example, 0.03, in Cx and/or Cy color coordinates. Furthermore, a luminous impression referred to as a white luminous impression may be produced by light which has a color rendering index (CRI) of greater than or equal to 70, preferably greater than or equal to 80 and particularly preferably greater than or equal to 90 or 95.

The optoelectronic component may be an inorganic light-emitting diode, or LED for short.

The optoelectronic component may have a semiconductor chip. The semiconductor chip is capable of emitting primary radiation from the blue spectral range. In particular, the semiconductor chip emits primary radiation from the blue spectral range during operation of the component. In particular, the semiconductor chip has a semiconductor layer sequence. The semiconductor layer sequence comprises semiconductor materials. The semiconductor layer sequence is preferably based on a III-V compound semiconductor material. For example, the semiconductor material is a nitride compound semiconductor material such as $AlnIn1-n-mGamN$, where 0 is $\leq n \leq 1$, 0 is $\leq m \leq 1$ and $n+m \leq 1$ respectively. Preferably for at least one layer or for all layers of the semiconductor layer sequence the following is fulfilled: $0 < n \leq 0.8$, $0.4 \leq m < 1$ and $n+m \leq 0.95$. The semiconductor layer sequence may contain dopants as well as additional components. For the sake of simplicity, however, only the essential components of the crystal lattice of the semiconductor layer sequence, i.e., Al, Ga, In or N, are given, even if they may be partially replaced and/or supplemented by small quantities of other substances.

The semiconductor layer sequence can have a conventional pn-junction, a double heterostructure, a single quantum well structure or a multiple quantum well structure as an active region. In addition to the active region, the semiconductor layer sequence can include other functional layers and functional regions such as p- or n-doped charge carrier transport layers, i.e., electron or hole transport layers, p- or n-doped confinement or cladding layers, buffer layers and/or electrodes as well as combinations thereof.

The component may have a conversion element. The conversion element has at least three phosphors. In particular, the conversion element has exactly three phosphors. The three phosphors are a first phosphor, a second phosphor and a third phosphor. Each of the phosphors is capable of converting the primary radiation emitted by the semiconductor chip into secondary radiation. In other words, the respective phosphors are configured to convert the primary radiation emitted by the semiconductor chip into secondary radiation during operation of the component. Preferably, the conversion element is arranged in the beam path of the primary radiation. The conversion element is capable of partial conversion. In other words, the primary radiation is not completely converted into secondary radiation, but the total radiation emitted from the component is a sum of primary and secondary radiation. In particular, the total radiation is white mixed radiation.

The component has a Ra value. The color rendering index Ra (or CRI for Color Rendering Index) is an index used to describe the quality of the color rendering of light sources. The index a in the formula symbol stands for the general color rendering index, which is calculated as the mean value of the first eight test colors.

In at least one example, the Ra value is at least 80. In particular, the Ra value is greater than or equal to 90, preferably greater than or equal to 91, 92, 93, 94, 95, 96, 97, 98 and/or 99.

In addition, the component has an R9 value.

Of the 14 test colors according to DIN, only the first eight (mixed colors) are included in the Ra (CRI). The ninth test color is saturated red. The R9 value is therefore a measure of the red component in the spectrum. The R9 value indicates a higher color rendering index for saturated red.

In at least one example, the R9 value is at least 75, preferably greater than or equal to 90, 91, 92, 93, 94, 95, 96, 97, 98 or 99.

The dominant wavelength λdom of the blue spectral range of the semiconductor chip may be less than 455 nm, 450 nm, 454 nm or 445 nm. The dominant wavelength can also be the peak wavelength λpeak.

The dominant wavelength is, in particular, the wavelength resulting from an intersection of the spectral color line of the CIE standard chromaticity diagram with a straight line, this straight line passing from the white point in the CIE standard chromaticity diagram through the actual color location of the radiation. In general, the dominant wavelength is different from the main peak wavelength.

The conversion element may have a first phosphor. The first phosphor is capable of emitting secondary radiation from the green spectral range.

The first phosphor may be selected from the following group or combinations thereof: Yttrium aluminium gallium garnet, lutetium aluminium garnet, lutetium aluminium gallium garnet, lutetium yttrium aluminium garnet, orthosilicate, nitridoorthosilicate.

The yttrium aluminium gallium garnet phosphor may be, for example, YaGaG. The yttrium aluminium gallium garnet phosphor can have the structural formula Y3(Al, Ga)5O12:Ce.

The lutetium aluminum garnet can be LuAG. The lutetium aluminium garnet may have the structural formula Lu3Al5O12:Ce.

The lutetium aluminium gallium garnet, for example, can be LuAGaG. The lutetium aluminium gallium garnet may have the structural formula Lu3(Al, Ga)5O12:Ce.

The lutetium yttrium aluminium garnet can be LuYAG, for example. The lutetium yttrium aluminium garnet may have the structural formula (Lu,Y)3Al5O12:Ce.

Nitrido orthosilicates can be, for example

AE2-x-aRExEuaSiO4-xNx or AE2-x-aRExEuaSi1-yO4-x-2yNx where RE=rare earth metal and AE=alkaline earth metal or (Ba,Sr,Ca,Mg)2SiO4:Eu2+.

The first, second and/or third phosphor is preferably selected from the following group provided that these phosphors have an emission in the corresponding spectral range: Eu2+-doped nitrides such as (Ca, Sr)AlSiN3:Eu2+, Sr(Ca, Sr) Si2Al2N6:Eu2+, (Sr,Ca)AlSiN3*Si2N2O:Eu2+, (Ca, Ba,Sr)2Si5N8:Eu2+, (Sr,Ca)[LiAl3N4]:Eu2+; garnets from the general system (Gd,Lu,Tb,Y)3(Al,Ga,D)5(O,X)12:RE where X=halide, N or divalent element, D=trivalent or tetravalent element and RE=rare earth metals such as Lu3(Al1-xGax)5O12:Ce3+, Y3(Al1-xGax)5O12:Ce3+; Eu2+-doped sulfides such as (Ca, Sr,Ba)S:Eu2+; Eu2+-doped SiONs such as (Ba,Sr,Ca)Si2O2N2:Eu2+; SiAlON, e.g., from the system LixMyLnzSi12-(m+n)Al(m+n)OnN16-n; beta-SiAlON from the system Sib-xAlzOyN8-y:REz where RE=rare earth metals; nitrido-orthosilicates such as AE2-x-aRExEuaSiO4-xNx or AE2-x-aRExEuaSi1-yO4-x-2yNx where RE=rare earth metal; and AE=alkaline earth metal or like (Ba,Sr,Ca,Mg)2SiO4:Eu2+; chlorosilicates like Ca8Mg(SiO4)4Cl2:Eu2+; chlorophosphates like (Sr,Ba,Ca,Mg)10(PO4)6Cl2:Eu2+; BAM phosphors from the BaO—MgO—Al2O3 system such as BaMgAl10O17:Eu2+; halophosphates such as M5(PO4)3(Cl,F):(Eu2+,Sb2+,Mn2+); SCAP phosphors such as (Sr,Ba,Ca)5(PO4)3Cl:Eu2+. In addition, so-called quantum dots can also be used as converter material. Quantum dots in the form of nanocrystalline materials containing a Group II-VI compound and/or a Group III-VI compound and/or a Group IV-VI compound and/or other metal nanocrystals are preferred thereby. Furthermore, the phosphor may have a quantum well structure and may have been grown epitaxially.

The conversion element may have a second phosphor. The second phosphor is capable of emitting radiation from the red spectral range. In particular, the second phosphor is an M2Si5N8 or a strontium calcium aluminium silicon nitride. M has at least Eu and additionally Ca, Sr and/or Ba. In particular, M is a combination of Ca, Sr, Ba and Eu. M can also be Ca, Sr or Ba, where M additionally has a doping, for example, with Eu or Ce. The phosphor can be or is doped. The doping is made in particular with Eu. The strontium calcium aluminium silicon nitride phosphor can be a Eu2+ doped nitride such as (Ca,Sr)AlSiN3:Eu2+, Sr(Ca, Sr)Si2Al2N6:Eu2+ or (Sr,Ca)AlSiN3*Si2N2O:Eu2+.

The component may have a third phosphor. The third phosphor is a Potassium-silicon-fluoride Fluorescent. In particular, the potassium-silicon-fluoride phosphor is a K2SiF6:Mn.

The second phosphor may have a larger half-width than the third phosphor. In particular, the second phosphor is broadband, whereas the third phosphor is a narrowband phosphor.

The second phosphor may have a half-width of 60 nm to 90 nm.

The third phosphor may have a half-width of 20 nm to 50 nm. A narrow-band phosphor has in particular half-widths of 20 nm to 50 nm. The potassium-silicon-fluoride (KSF) phosphor has a linear spectrum of several emission lines, each with only a few nm half-width. An imaginary envelope over all individual lines would have a spectral width of about 30 nm.

The potassium-silicon-fluoride phosphor has negative intrinsic properties. Although these negative properties can be improved, they cannot be completely eliminated. Potassium-silicon-fluoride phosphors have therefore only been used to a limited extent to date since they are limited, for example, in the use of optoelectronic components regarding operating currents and temperatures.

We found that the disadvantages of potassium-silicon-fluoride phosphor can be reduced or avoided by adding a second phosphor that also emits radiation from the red spectral range. In particular, the second phosphor is a stable nitride phosphor. By adding a second phosphor, the major part of the conversion in the red spectral range can be taken over by the second phosphor, which does not exhibit the described negative properties of the potassium-silicon-fluoride phosphor. In particular, just as much potassium-silicon-fluoride phosphor is added as is required for the CRI/R9 requirement. This dilution effect also reduces the effects of the negative properties of the third phosphor on the entire phosphor system.

The addition of a broadband second phosphor does not contradict the aforementioned advantages of narrowband third phosphors. The use of narrow-band third phosphors as a long-wave red component is advantageous in terms of efficiency, since, for example, less red is produced in the low lumen-weighted range. The additional, short-wave red phosphor can be broadband. In addition, the addition of the second phosphor provides flexibility in the selection of the first phosphor and the semiconductor chip used, especially in high CRI applications.

We found that without the second phosphor, only a few systems with the required Ra and R9 values are possible. Compared to components with exactly two phosphors, for example, a first phosphor and a third phosphor, i.e., a potassium-silicon-fluoride phosphor, such components require semiconductor chips having primary radiation from the long blue spectral range. The reason is that a single phosphor cannot completely close the spectral range between the blue semiconductor chip emission and the red emitting potassium-silicon-fluoride phosphor. The resulting spectral gap does not allow high Ra values (CRI). This can only be achieved by a long-wave green emitting first phosphor in combination with a very long-wave blue emitting semiconductor chip.

We also found that addition of a second phosphor that emits radiation from the red spectral range results in almost unlimited possibilities of combinations of the phosphors with potassium-silicon-fluoride and a semiconductor chip that emits radiation from the blue spectral range. The second phosphor fills the spectral gap between the first phosphor and the third phosphor and therefore also allows the use of short-wave first phosphors and correspondingly short-wave semiconductor chips.

With our optoelectronic component, high Ra/R9 values can be achieved with spectral efficiencies that are significantly higher than those of conventional optoelectronic components.

The proportion of potassium-silicon-fluoride phosphor may be 55 wt-% to 82 wt-%, in particular 55 wt-% to 60 wt %, relative to the total proportion of second and third phosphor. A more highly doped KSF derivative is also possible, the absorption of which would then be higher and the necessary concentrations lowered.

The proportion of the potassium-silicon-fluoride phosphor may be 80 wt-% to 84 wt-% relative to the total proportion of the second and third phosphors.

The minimum proportion of potassium-silicon-fluoride phosphor may be 53 wt-% to 67 wt-% relative to the total proportion of second and third phosphor. The minimum proportion is the proportion of the third phosphor in the red component to generate the required Ra and R9 values of the component.

As far as the proportion of the third phosphor in the system is concerned, the weight proportion is high, but the spectral proportion of the third phosphor in the white spectrum is rather small. This is due in particular to the poor absorption properties of the third phosphor.

The first phosphor may be an yttrium-aluminium-gallium garnet and the second phosphor may be either M2Si5N8 or a strontium-calcium-aluminium-silicon nitride.

The first phosphor may be a lutetium yttrium aluminum garnet and the second phosphor may be either M2Si5N8 or a strontium calcium aluminum silicon nitride.

The first phosphor may be a lutetium aluminium gallium garnet and the second phosphor may be either M2Si5N8 or a strontium calcium aluminium silicon nitride.

The first phosphor may be a lutetium aluminium garnet and the second phosphor may be either M2Si5N8 or a strontium calcium aluminium silicon nitride.

The third phosphor contained in these examples is in particular the potassium-silicon-fluoride (KSF) phosphor.

The first phosphor may be an orthosilicate and the second phosphor may be either M2Si5N8 or a strontium calcium aluminum silicon nitride.

The first phosphor may be a nitridoorthosilicate and the second phosphor may be either M2Si5N8 or a strontium calcium aluminum silicon nitride.

Compared to a binary system, for example, a system consisting of a lutetium yttrium aluminium garnet as green component and a potassium-silicon-fluoride (KSF) phosphor as red component, our optoelectronic component has advantageous properties.

Advantages and developments of our described components will become apparent from the examples described below in association with the figures.

In the examples and figures, identical or equivalent components are each provided with the same reference signs. The elements shown and their proportions are not to be regarded as true to scale. Furthermore, the same examples of phosphors are provided with the same abbreviations.

Table 1 shows components according to several examples and a binary comparison example. These examples can be part of the examples of the following figures.

TABLE 1

| First phosphor | Second phosphor | Third fluorescent | Wavelength of primary radiation in nm (λpeak) |
| --- | --- | --- | --- |
| YAGaG | M2Si5N8 | KSF | |
| YAGaG | SCASN | KSF | >445 |
| LuAG | M2Si5N8 | KSF | |
| LuAG | SCASN | KSF | |
| LuAGaG | M2Si5N8 | KSF | |
| LuAGaG | SCASN | KSF | >445 |

TABLE 1-continued

| First phosphor | Second phosphor | Third fluorescent | Wavelength of primary radiation in nm (λpeak) |
| --- | --- | --- | --- |
| LuYAG | M2Si5N8 | KSF | |
| LuYAG | SCASN | KSF | >455 |
| orthosilicate | M2Si5N8 | KSF | |
| orthosilicate comparison | SCASN | KSF | |
| LuYAG | — | KSF | >455 |

FIG. 1 shows a schematic side view of an optoelectronic component according to an example.

According to FIG. 1A, the optoelectronic component 100 has a lead frame 9. In addition, the optoelectronic component has a carrier or substrate 5. A semiconductor chip 4 is arranged on the lead frame 9. The semiconductor chip 4 has a semiconductor layer sequence. The semiconductor chip is configured to emit radiation from the blue spectral range, for example, with a dominant wavelength of 450 nm. The semiconductor chip 4 is arranged inside a recess 7. The recess 7 is part of a housing 6. The recess 7 can be filled with a potting. The potting can have a matrix material 8. The first phosphor, the second phosphor and the third phosphor can be embedded in the matrix material. The embedding can be homogeneous or inhomogeneous. Other particles may also be embedded in the potting. The other particles can be scattering and/or filter particles (not shown here). The matrix material can be silicone or epoxy resin.

The conversion element surrounds the semiconductor chip 4 in a material-locking and form-fitting manner and at least partially converts the primary radiation emitted by the semiconductor chip 4 into secondary radiation. The first phosphor 1 emits the primary radiation into secondary radiation from the green spectral range, the second phosphor 2 emits the primary radiation into secondary radiation from the red spectral range, especially into broadband red spectral radiation, and the third phosphor 3 is especially a potassium-silicon-fluoride phosphor.

Narrowband can, e.g., mean a half-width of 20 nm to 50 nm.

The third phosphor 3 emits the primary radiation in secondary radiation from the red spectral range, preferably in narrow-band spectral radiation. The total radiation 11 emitted from the optoelectronic component 100 is white mixed radiation. The component has an Ra value of at least 80 and an R9 value of at least 75. The R9 value of 75 refers in particular to a high Ra solution with Ra>90. For CRI80 an R9 limit of >0 is also practicable.

FIG. 1B shows a schematic side view of an optoelectronic component according to an example. The semiconductor chip 4 is arranged on a carrier or substrate 5. For example, the substrate may have one or more materials in the form of a layer, plate, foil or laminate selected from glass, quartz, plastic, metal, silicon, wafer. In particular, the substrate is a silicon wafer.

The conversion element 10 is arranged on the radiation main side 12 of the semiconductor chip 4. The conversion element 10 can have a matrix material 8 and the three phosphors 1, 2 and 3. The conversion element 10, for example, can be prefabricated and applied to the radiation main side 12 of the semiconductor chip 4 in a so-called "pick-and-place" process. Preferably, the side surfaces 13 of the semiconductor chip 4 are free of the conversion element of the optoelectronic component 100.

FIG. 1C describes a schematic side view of an optoelectronic component according to an example. The semiconductor chip 4 is arranged on a carrier 5. The carrier can be a ceramic, for example. The conversion element 10 surrounds the semiconductor chip 4 on all sides. The conversion element 10 can have at least the three phosphors 1, 2 and 3. The conversion element 10 can be formed as a ceramic. Alternatively, the three phosphors 1, 2 and 3 are embedded in a matrix material 8, for example, silicone.

FIG. 1D shows a schematic side view of an optoelectronic component 100 according to an example. The semiconductor chip 4 is arranged on the carrier 5. A conversion element 10 is arranged in the beam path of the semiconductor chip 4. The conversion element has at least two sublayers. The first sublayer is directly downstream of the semiconductor chip 4. The first sublayer contains the first phosphor 1. The first phosphor 1 can be without matrix material 8 or embedded in a matrix material. In particular, the first sublayer is arranged directly on the radiation main side 12 of the semiconductor chip 4. The first sublayer can be followed by a second sublayer. The second sublayer may contain a mixture of the second phosphor 2 and the third phosphor 3. The second sublayer can be ceramic, or the second and third phosphors are distributed in a matrix material 8, for example, silicone. The second sublayer is preferably placed directly after the first sublayer.

Alternatively, the order of the first and second sublayer can also be reversed. In other words, the second sublayer can follow the semiconductor chip 4 directly, and the first sublayer then follows the second sublayer directly.

FIG. 1E shows a schematic side view of an optoelectronic component 100 according to an example. The semiconductor chip 4 is arranged on a carrier 5. Conversion element 10 has three sublayers. The first sublayer contains the first phosphor 1. The second sublayer contains the second phosphor 2. The third sublayer contains the third phosphor 3. The sublayers can then be arranged in the direction away from the semiconductor chip 4 as follows: first sublayer, second sublayer and third sublayer.

Alternatively, the order can be in the direction away from the semiconductor chip 4: second sublayer, third sublayer, first sublayer.

Alternatively, the order can be in the direction away from the semiconductor chip 4: third sublayer, first sublayer, second sublayer.

Figure 2:
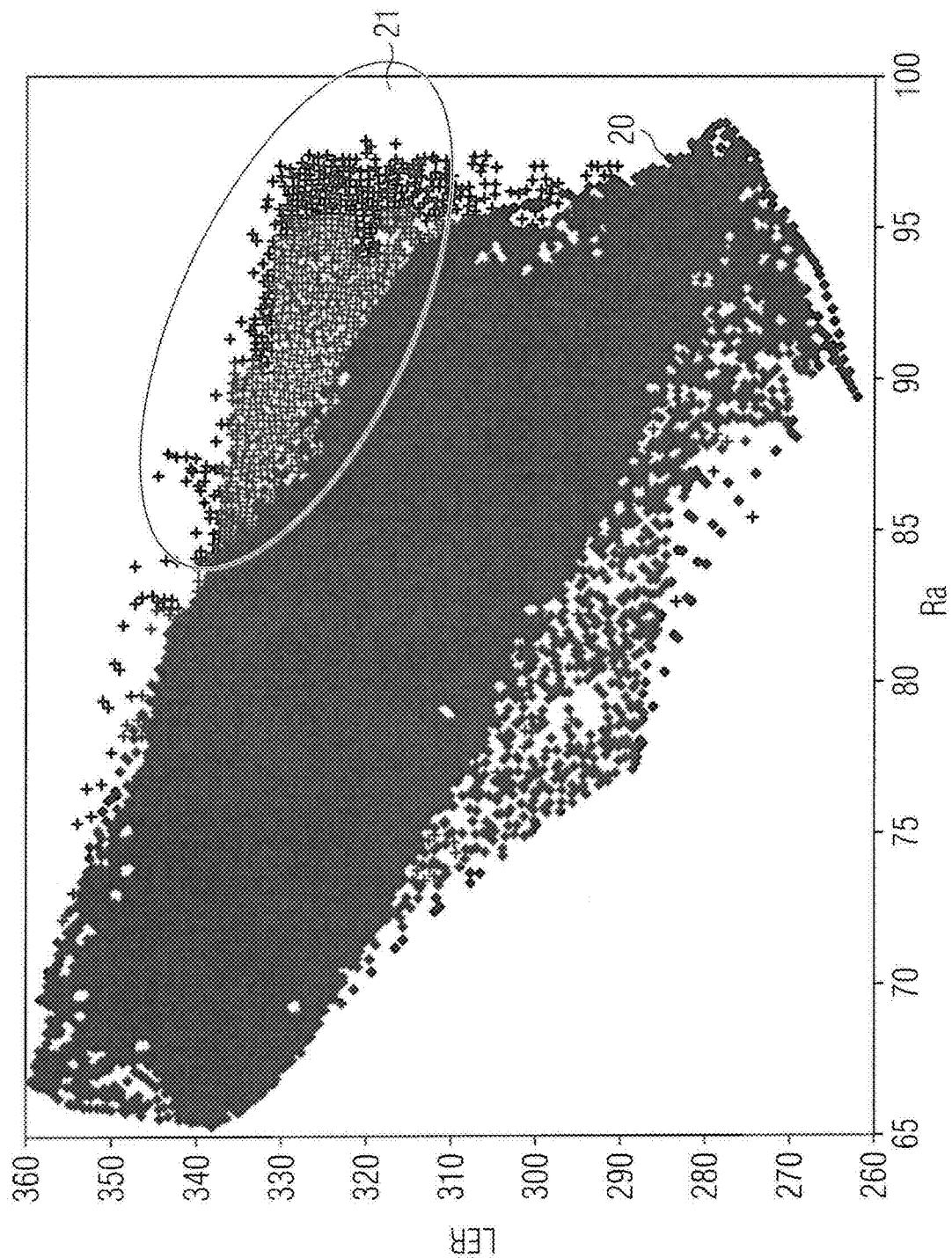
FIG. 2 shows the LER as a function of Ra of a comparison example and an example.

FIG. 2 shows the dependence of the efficiency LER (with the unit lumen per optical watt) on the Ra value. Comparison examples and examples are shown. Area 20 shows the comparison examples, area 21 shows the optoelectronic component according to an example.

The comparison examples are in particular components with only two phosphors, a green emitting phosphor and a red emitting phosphor. The comparison examples show no potassium-silicon-fluoride phosphor.

The component has at least three phosphors and was simulated at 4000 K at a peak wavelength of 445, 450 and 455 nm. In comparison to the comparison examples, the component shows high light quality with high efficiency at the same time.

Figure 3:
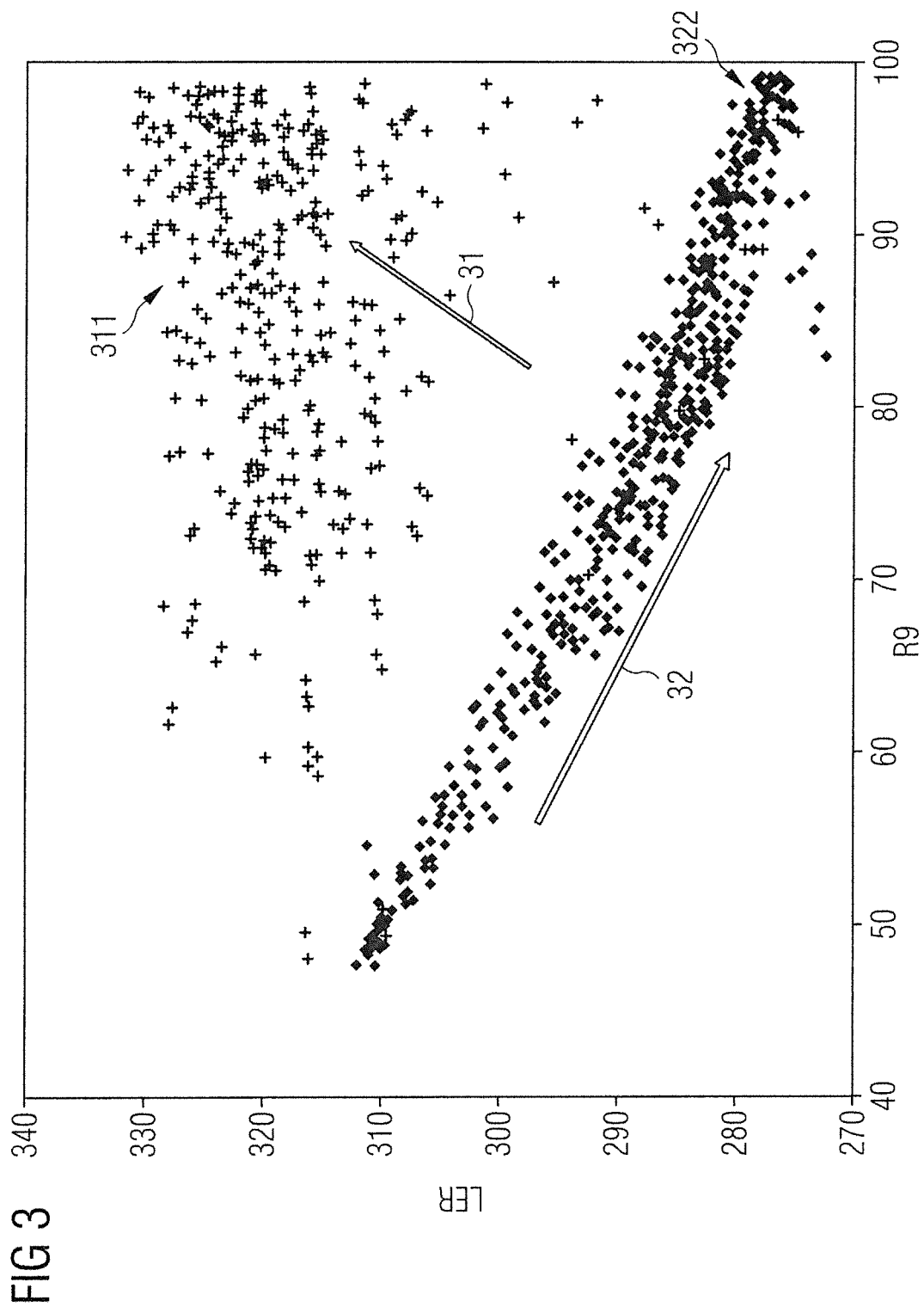
FIG. 3 is a presentation of the efficiency advantage of comparison examples and examples.

FIG. 3 shows the LER depending on R9 as a simulation. The efficiency advantages of comparison examples (322) and examples (311, x) are shown. The comparison examples contain no potassium-silicon-fluoride phosphor. The examples show potassium-silicon-fluoride. The simulation was performed at 4000 K, at a peak wavelength of 445 nm and a CRI of greater than 92.

Compared to the respective comparison example, our component shows a high quality and a high LER value (see arrow 31 compared to arrow 32).

Figure 4:
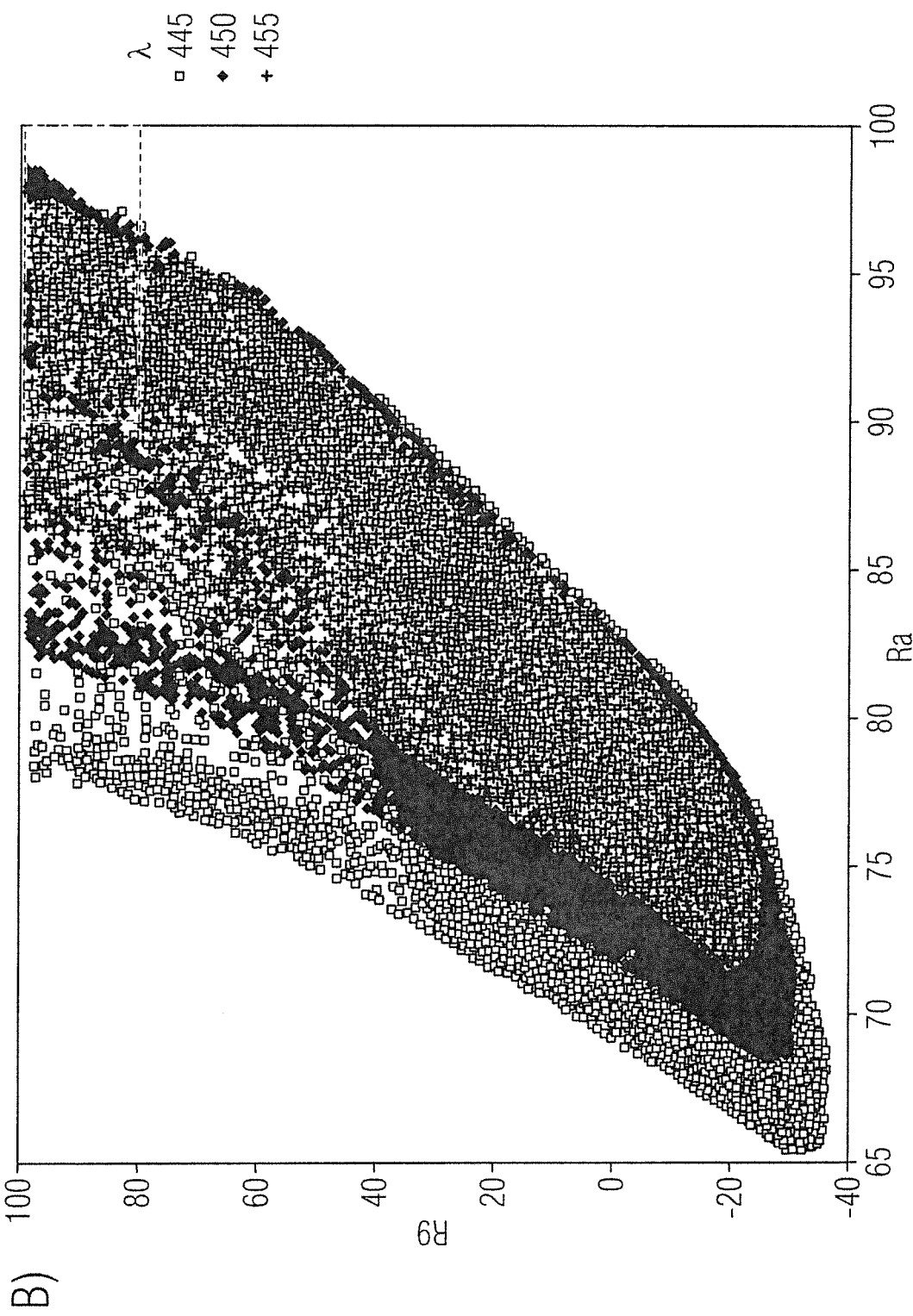
FIG. 4A shows dependence of the R9 on Ra of a comparison example.
FIG. 4B shows dependence of R9 on Ra of examples.

FIG. 4A shows a simulation of the R9 as a function of the R8 value of comparison examples at wavelengths of 445 nm, 450 nm and 455 nm.

The "target square" is also defined, i.e., the area that has an Ra value of at least 80 and an R9 value of at least 75. A simulation of examples with exclusively potassium-silicon-fluoride as red component is shown in FIG. 4A and in comparison an optoelectronic component according to an example in FIG. 4B.

FIG. 4B shows the dependence of the R9 value on Ra at wavelengths of 445 nm, 450 nm and 455 nm for examples.

A comparison of the two diagrams in FIGS. 4A and 4B clearly shows that our component makes more and better possible combinations of fluorescent systems compared to the comparison examples with the required Ra and R9 values. In addition, the usable chip wavelength range is increased by our component.

FIGS. 5A to 5B show the dependence of the Ra value on the concentration of the third phosphor c KSF in %. Potassium-silicon-fluoride (KSF) is specified as the third phosphor in percent. The proportion c KSF in % refers to the total proportion from the proportions of the second and third phosphor.

FIG. 5C shows the efficiency LER as a function of the concentration of the third phosphor KSF in percent. A conversion element 10 of an optoelectronic component 100 with a first, second and third phosphor was simulated.

FIGS. 5A and 5B show that a concentration of KSF of 100% in the mixture is not necessary for sufficient color rendering. Equivalent color rendering can also be achieved with approximately 60 wt-% KSF and 40 wt-% of the second phosphor, whereby efficiency can also be increased (see FIG. 5C).

FIG. 5A shows a minimum concentration of KSF from about 50 wt-%. At approx. 80 wt-% KSF based on the total proportion of second and third phosphor, the Ra value is maximum.

FIG. 5B shows the minimum KSF concentration of 65 wt-% for R9=80 and a maximum KSF concentration of 80 wt-% for a maximum R9 value of about 100.

The graph in FIG. 5C shows that the lower the concentration of the third phosphor is, the higher is the spectral efficiency LER.

Figure 6:
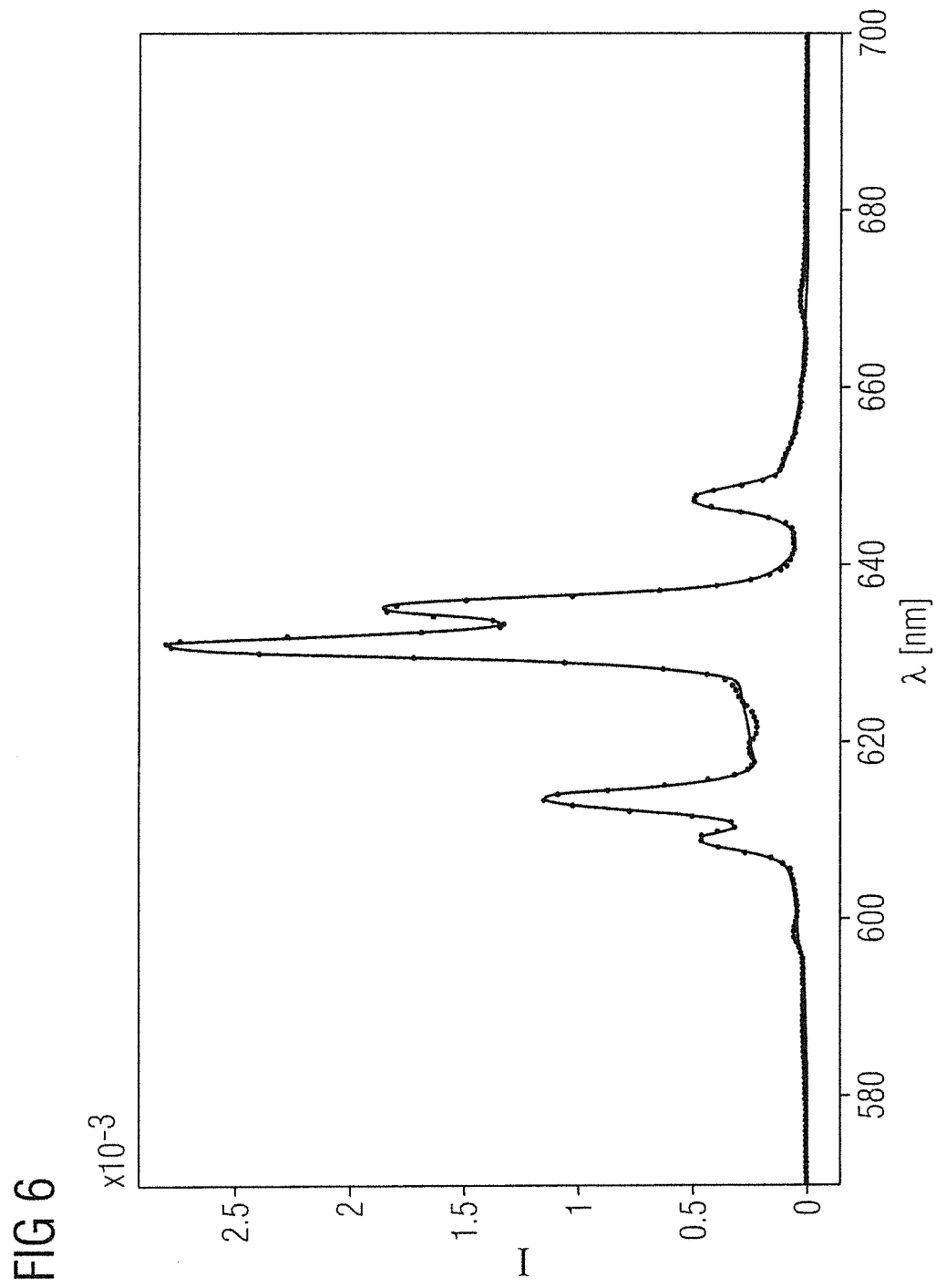
FIG. 6 shows a potassium-silicon-fluoride emission spectrum.

FIG. 6 shows a potassium-silicon-fluoride (KSF) emission spectrum. The intensity is shown as a function of the wavelength.

We found that by using a minimum concentration of the third phosphor in the optoelectronic component according to the example, maximum efficiency can be achieved.

The examples described in connection with the figures and their characteristics can also be combined with each other according to further examples, even if such combinations are not explicitly shown in the figures. Furthermore, the examples described in connection with the figures may have additional or alternative features as described in the general part of the specification.

This application claims priority of DE 102018101428.7, the subject matter of which is incorporated herein by reference.

Our components are not restricted to the examples by the description on the basis of the examples. Rather, this disclosure encompasses any new feature and also any combination of features, which in particular comprises any combination of features in the appended claims and any combination of features in the examples, even if the feature or combination itself is not explicitly specified in the claims or examples.

The invention claimed is:

1. An optoelectronic component comprising:
a semiconductor chip that emits primary radiation from the blue spectral region,
a conversion element comprising at least three phosphors each converting the primary radiation into secondary radiation,
wherein the first phosphor emits secondary radiation from the green spectral region,
the second phosphor emits secondary radiation from the red spectral region,
the third phosphor is a potassium-silicon-fluoride phosphor that emits secondary radiation from the red spectral region,
the component has an Ra value of at least 80 and an R9 value of at least 75, and emits white mixed radiation, and
the second phosphor has a half-width of at least 60 nm to at most 90 nm.

2. The optoelectronic component according to claim 1, wherein a dominant wavelength (Mom) of the blue spectral region of the semiconductor chip is less than 455 nm.

3. The optoelectronic component according to claim 1, wherein the first phosphor is selected from the group consisting of yttrium aluminum gallium garnet, lutetium aluminum garnet, lutetium aluminum gallium garnet, lutetium yttrium aluminum garnet, ortho silicate and nitridoorthosilicate.

4. The optoelectronic component according to claim 1, wherein the second phosphor is M2Si5N8 or a strontium calcium aluminum silicon nitride, M having at least Eu and additionally Ca, Sr and/or Ba.

5. The optoelectronic component according to claim 1, wherein the third phosphor is K2SiF6:Mn.

6. The optoelectronic component according to claim 1, wherein the third phosphor has a half-width of at least 20 nm to at most 50 nm.

7. The optoelectronic component according to claim 1, wherein the Ra value is greater than 90.

8. The optoelectronic component according to claim 1, wherein the Ra value is greater than 97.

9. The optoelectronic component according to claim 1, wherein the R9 value is greater than 90.

10. The optoelectronic component according to claim 1, wherein the R9 value is greater than 95.

11. The optoelectronic component according to claim 1, wherein the first phosphor is an yttrium aluminum gallium garnet and the second phosphor is either M2Si5N8 or a strontium calcium aluminum silicon nitride.

12. The optoelectronic component according to claim 1, wherein the first phosphor is a lutetium aluminum garnet or lutetium aluminum gallium garnet and the second phosphor is either M2Si5N8 or a strontium calcium aluminum silicon nitride.

13. The optoelectronic component according to claim 1, wherein the first phosphor is a lutetium yttrium aluminum garnet and the second phosphor is either M2Si5N8 or a strontium calcium aluminum silicon nitride.

14. The optoelectronic component according to claim 1, wherein the first phosphor is an orthosilicate or nitridoorthosilicate and the second phosphor is either M2Si5N8 or a strontium calcium aluminum silicon nitride.

15. The optoelectronic component according to claim 1, wherein a proportion of the potassium-silicon-fluoride phosphor is at least 55 wt-% to at most 82 wt-% relative to the total proportion of the second and third phosphors.

16. The optoelectronic component according to claim 1, wherein a proportion of the potassium-silicon-fluoride phosphor is at least 80 wt-% to at most 84 wt-% relative to the total proportion of the second and third phosphors.

17. The optoelectronic component according to claim 1, wherein a minimum proportion of the potassium-silicon-fluoride phosphor is at least 53 wt-% and at most 67 wt-% relative to the total proportion of said second and third phosphors.

18. An optoelectronic component comprising:
a semiconductor chip that emits primary radiation from the blue spectral region,
a conversion element comprising at least three phosphors each converting the primary radiation into secondary radiation,
wherein the first phosphor emits secondary radiation from the green spectral region,
the second phosphor emits secondary radiation from the red spectral region,
the third phosphor is a potassium-silicon-fluoride phosphor that emits secondary radiation from the red spectral region, and
the component has an Ra value of at least 80 and an R9 value of at least 75, and emits white mixed radiation, and
wherein a proportion of the potassium-silicon-fluoride phosphor is at least 55 wt-% to at most 82 wt-% relative to the total proportion of the second and third phosphors, or a proportion of the potassium-silicon-fluoride phosphor is at least 80 wt-% to at most 84 wt-% relative to the total proportion of the second and third phosphors, or a minimum proportion of the potassium-silicon-fluoride phosphor is at least 53 wt-% to at most 67 wt-% relative to the total proportion of the second and third phosphors.

19. The optoelectronic component according to claim 18, wherein the second phosphor has a half-width of at least 60 nm to at most 90 nm.

20. An optoelectronic component comprising:
a semiconductor chip that emits primary radiation from the blue spectral region,
a conversion element comprising at least three phosphors each converting the primary radiation into secondary radiation,
wherein the first phosphor emits secondary radiation from the green spectral region,
the second phosphor emits secondary radiation from the red spectral region,
the third phosphor is a potassium-silicon-fluoride phosphor that emits secondary radiation from the red spectral region,
the component has an Ra value of at least 80 and an R9 value of at least 75, and emits white mixed radiation,
wherein the second phosphor is M2Si5N8 or a strontium calcium aluminum silicon nitride, M having at least Eu and additionally Ca, Sr and/or Ba, or
the first phosphor is an yttrium aluminum gallium garnet and the second phosphor is either M2Si5N8 or a strontium calcium aluminum silicon nitride, or
the first phosphor is a lutetium aluminum garnet or lutetium aluminum gallium garnet and the second phosphor is either M2Si5N8 or a strontium calcium aluminum silicon nitride, or
the first phosphor is a lutetium yttrium aluminum garnet and the second phosphor is either M2Si5N8 or a strontium calcium aluminum silicon nitride, or the first phosphor is an orthosilicate or nitridoorthosilicate and the second phosphor is either M2Si5N8 or a strontium calcium aluminum silicon nitride.

\* \* \* \* \*

UNITED STATES PATENT AND TRADEMARK OFFICE
CERTIFICATE OF CORRECTION

PATENT NO. : 10,868,223 B2
APPLICATION NO. : 16/254659
DATED : December 15, 2020
INVENTOR(S) : Butendeich et al.

Page 1 of 1

It is certified that error appears in the above-identified patent and that said Letters Patent is hereby corrected as shown below:

In the Claims

<u>In Column 11</u>
At Line 21, please change "(Mom)" to -- ($\lambda$dom) --; and at Line 27, please change "ortho silicate" to -- orthosilicate --.

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*